US012467125B2

(12) United States Patent
Hong et al.

(10) Patent No.: US 12,467,125 B2
(45) Date of Patent: Nov. 11, 2025

(54) LOADING APPARATUS FOR DEPOSITION MASK

(71) Applicant: Samsung Display Co., LTD., Yongin-si (KR)

(72) Inventors: Kyongho Hong, Hwaseong-si (KR); Myungkyu Kim, Cheonan-si (KR); Chang-Kon Park, Cheonan-si (KR); Sukbeom You, Anyang-si (KR); Dongjae Lee, Cheonan-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 715 days.

(21) Appl. No.: 17/894,625

(22) Filed: Aug. 24, 2022

(65) Prior Publication Data

US 2023/0147723 A1 May 11, 2023

(30) Foreign Application Priority Data

Nov. 10, 2021 (KR) ........................ 10-2021-0154322

(51) Int. Cl.
*C23C 14/04* (2006.01)

(52) U.S. Cl.
CPC .................................. *C23C 14/042* (2013.01)

(58) Field of Classification Search
None
See application file for complete search history.

(56) References Cited

U.S. PATENT DOCUMENTS

2021/0060700 A1* 3/2021 Okamoto ............... H05B 33/10

FOREIGN PATENT DOCUMENTS

| | | | | |
|---|---|---|---|---|
| KR | 10-2019-0085277 | | 7/2019 | |
| KR | 20200009799 A | * | 1/2020 | H01L 51/56 |
| KR | 10-2020-0051702 | | 5/2020 | |
| KR | 10-2193019 | | 12/2020 | |
| KR | 102193044 B1 | * | 12/2020 | G03F 7/2063 |
| KR | 10-2254375 | | 5/2021 | |

OTHER PUBLICATIONS

English translation for KR102193019B1.*
English translation for KR20200009617.*
English translation for KR20190085277.*
English translation of KR102193044B1.*
English translation of KR20200009799.*

* cited by examiner

*Primary Examiner* — Charles Capozzi
(74) *Attorney, Agent, or Firm* — CANTOR COLBURN LLP

(57) ABSTRACT

A loading apparatus for a deposition mask includes a clamper that clamps the mask extending in a direction, a first adsorption part, a second adsorption part, and a connection part connected to the first adsorption part and the second adsorption part, and includes a picker that transfers the mask. In case that the picker transfers the mask, the first adsorption part adsorbs ends of the mask, the second adsorption unit adsorbs a portion between the ends of the mask, and the clamper clamps the mask between the first adsorption part and the second adsorption part.

20 Claims, 11 Drawing Sheets

LOADING APPARATUS FOR DEPOSITION MASK

CROSS REFERENCE TO RELATED APPLICATION(S)

This application claims priority to and benefits of Korean Patent Application No. 10-2021-0154322 under 35 U.S.C. § 119, filed on Nov. 10, 2021, in the Korean Intellectual Property Office (KIPO), the entire contents of which are incorporated herein by reference.

BACKGROUND

1. Technical Field

Implementations of the disclosure relate generally to a loading apparatus for a deposition mask. Specifically, implementations of the disclosure relate a loading apparatus a deposition mask used in a manufacture of an organic light emitting display device.

2. Description of the Related Art

A deposition mask may include a frame and a mask. The mask may define a pattern area. A deposition material may pass through the pattern area to form a component of a display device. A loading apparatus for the deposition mask may load the mask onto the frame. In case that the mask is not loaded flatly on the frame, a defect may occur in the display device, such as the components are not formed at preset positions.

SUMMARY

Embodiments provide a loading apparatus for a deposition mask with improved reliability.

A loading apparatus for a deposition mask may include a clamper that clamps a mask extending in a first direction, and a picker including a first adsorption part, a second adsorption part, and a connection part connected to the first adsorption part and the second adsorption part, and transferring the mask to the clamper. In case that the picker transfers the mask, the first adsorption part may adsorb ends of the mask and the second adsorption part may adsorb a portion between the ends of the mask. The clamper may clamp the mask between the first adsorption part and the second adsorption part.

In an embodiment, the clamper may include a lower clamper, and an upper clamper disposed on the lower clamper and including a first groove.

In an embodiment, the first groove may be in a lower surface of the upper clamper.

In an embodiment, a depth of the first groove may be greater than a height of the first adsorption part.

In an embodiment, a width of the first groove may be greater than a width of the first adsorption part.

In an embodiment, the picker may transfer the mask between the lower clamper and the upper clamper.

In an embodiment, the first adsorption part may be positioned in the first groove.

In an embodiment, the second adsorption part may be positioned outside the first groove.

In an embodiment, the picker may move in a vertical direction after the picker is separated from the mask.

In an embodiment, the first adsorption part may be spaced apart from the upper clamper.

In an embodiment, the lower clamper may include a second groove corresponding to the first groove.

In an embodiment, the second groove may be in an upper surface of the lower clamper.

In an embodiment, the lower clamper may have a shape symmetrical to a shape of the upper clamper.

In an embodiment, the first adsorption part and the second adsorption part may adsorb an upper surface of the mask.

In an embodiment, the first adsorption part may adsorb the mask using vacuum.

In an embodiment, the second adsorption part may adsorb the mask using vacuum or magnetic force.

In an embodiment, the first adsorption part may prevent the ends of the mask from sagging.

In an embodiment, the second adsorption part may support the mask.

In an embodiment, the first adsorption part and the second adsorption part may extend in a second direction intersecting the first direction.

Therefore, a loading apparatus for a deposition mask may include a picker and a clamper. The picker may include a first adsorption unit for adsorbing both ends of the mask. Accordingly, the picker may transfer and load the mask in a flat state to the clamper. The clamper may include an upper clamper and a lower clamper. The upper clamper may include a first groove providing a space in which the first adsorption unit is disposed. The lower clamper may have a shape symmetrical to the upper clamper. Accordingly, the clamper may clamp the mask while maintaining a flat state. Because of this, the mask can be welded to the frame in a flat state. Thus, the reliability of the deposition mask loading apparatus may be improved.

It is to be understood that both the foregoing general description and the following detailed description are examples and are intended to provide further explanation of the disclosure.

BRIEF DESCRIPTION OF THE DRAWINGS

The accompanying drawings, which are included to provide a further understanding of the disclosure and are incorporated in and constitute a part of this specification, illustrate embodiments of the disclosure together with the description.

DETAILED DESCRIPTION OF THE EMBODIMENTS

Illustrative, non-limiting embodiments will be more clearly understood from the following detailed description in conjunction with the accompanying drawings.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements.

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Figure 1:
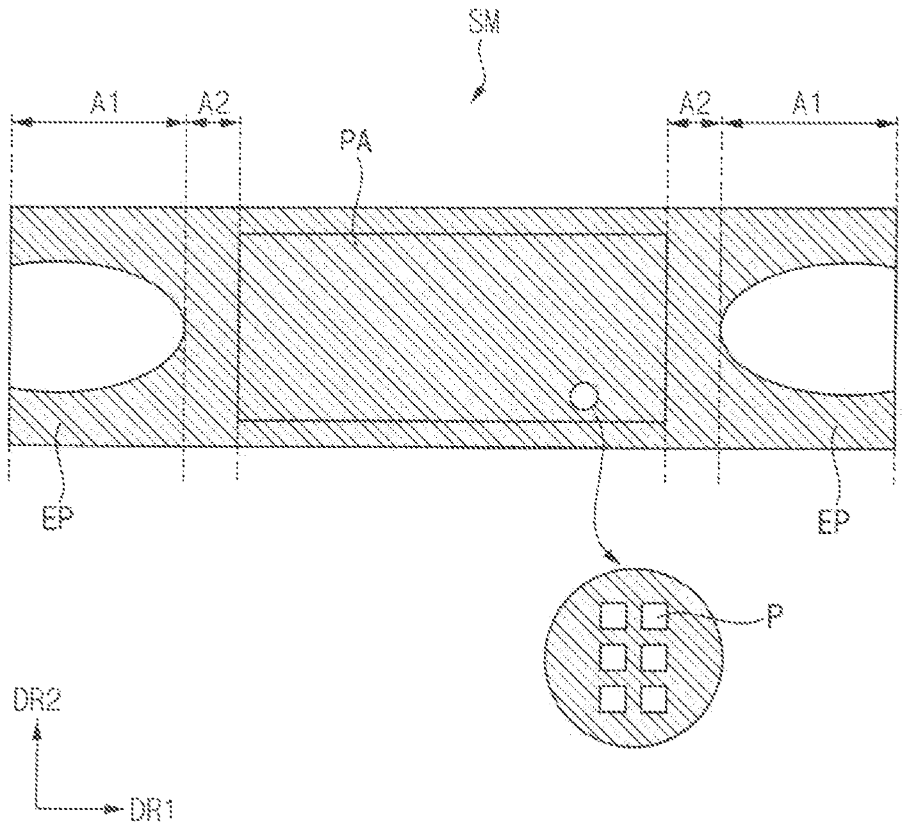
FIG. 1 is a schematic plan view illustrating a mask.
Figure 2:
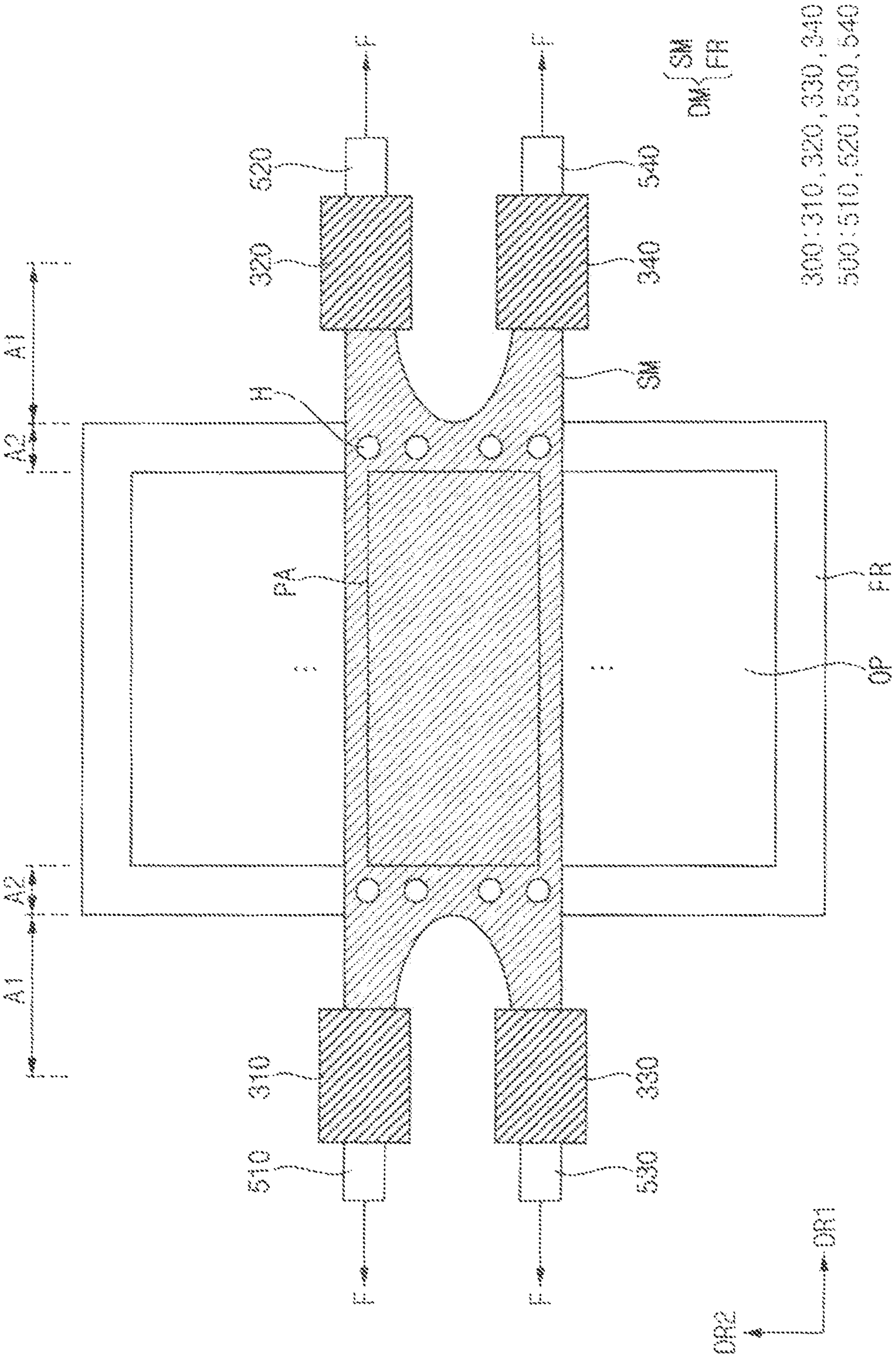
FIG. 2 is a schematic plan view illustrating a deposition mask including the mask of FIG. 1.

FIG. 1 is a schematic plan view illustrating a mask. FIG. 2 is a schematic plan view illustrating a deposition mask including the mask of FIG. 1.

Referring to FIGS. 1 and 2, a deposition mask DM may include a frame FR and a mask SM.

The frame FR may be disposed on a plane defined by a first direction DR1 and a second direction DR2 intersecting the first direction DR1. The second direction DR2 may be perpendicular to the first direction DR1. The frame FR may have a rectangular shape. The frame FR may include an opening OP in a center. The frame FR may include a metal. The frame FR may have a thickness (e.g., a predetermined or selected thickness).

The mask SM may be disposed on the frame FR. The mask SM may extend in the first direction DR1. The mask SM may include a metal. The mask SM may have a relatively thin thickness. For example, the thickness of the mask SM may be smaller than the thickness of the frame FR. The mask SM may include a pattern area PA, a first area A1, and a second area A2.

The pattern area PA may be located in a central portion of the mask SM. The pattern area PA may overlap the opening OP of the frame FR (e.g., in a plan view). The pattern area PA may include patterns P. A deposition material may pass through the patterns P in the pattern area PA.

The first area A1 may be spaced apart from the pattern area PA. The first area A1 may be located on the side of the mask SM. An end EP of the mask SM may be positioned in the first area A1.

The second area A2 may be positioned between the pattern area PA and the first area A1. The second area A2 may overlap the frame FR (e.g., in a plan view). The mask SM may be welded to the frame FR in a welding area H of the second area A2.

A clamper 300 may be disposed adjacent to the frame FR. The clamper 300 may include a first clamper 310, a second clamper 320, a third clamper 330, and a fourth clamper 340. Each of the first clamper 310, the second clamper 320, the third clamper 330, and the fourth clamper 340 may clamp (or fasten) the end EP of the mask SM.

In case that the clamper 300 clamps the mask SM, the mask SM needs to be flat. In case that the mask SM is not flat, the patterns P may not be arranged at preset positions. Accordingly, a defect may occur in a display device manufactured using the deposition mask DM. For example, the end EP of the mask SM may droop because of gravity. Therefore, while the mask SM is loaded by the clamper 300, the mask SM needs to be flat.

A tensioner 500 may be connected to the clamper 300. The tensioner 500 may include a first tensioner 510, a second tensioner 520, a third tensioner 530, and a fourth tensioner 540. The first tensioner 510, the second tensioner 520, the third tensioner 530, and the fourth tensioner 540 may apply a tensile force F to the first clamper 310, the second clamper 320, the third clamper 330, and the fourth clamper 340, respectively. In case that the clamper 300 clamps the mask SM, the tensioner 500 may apply the tension force F to the clamper 300, so that the tensioner 500 may tension the mask SM. For example, the first tensioner 510 connected to the first clamper 310 and the third tensioner 530 connected to the third clamper 330 may apply the tension force F in a direction opposite to the first direction DR1, and the second tensioner 520 connected to the second clamper 320 and the fourth tensioner 540 connected to the fourth clamper 340 may apply the tension force F in the first direction DR1.

After the tensioner 500 tensions the mask SM, the mask SM may be attached and may be fixed to the frame FR. For example, the mask SM may be welded to the frame FR. Accordingly, the deposition mask DM may be manufactured.

Figure 3:
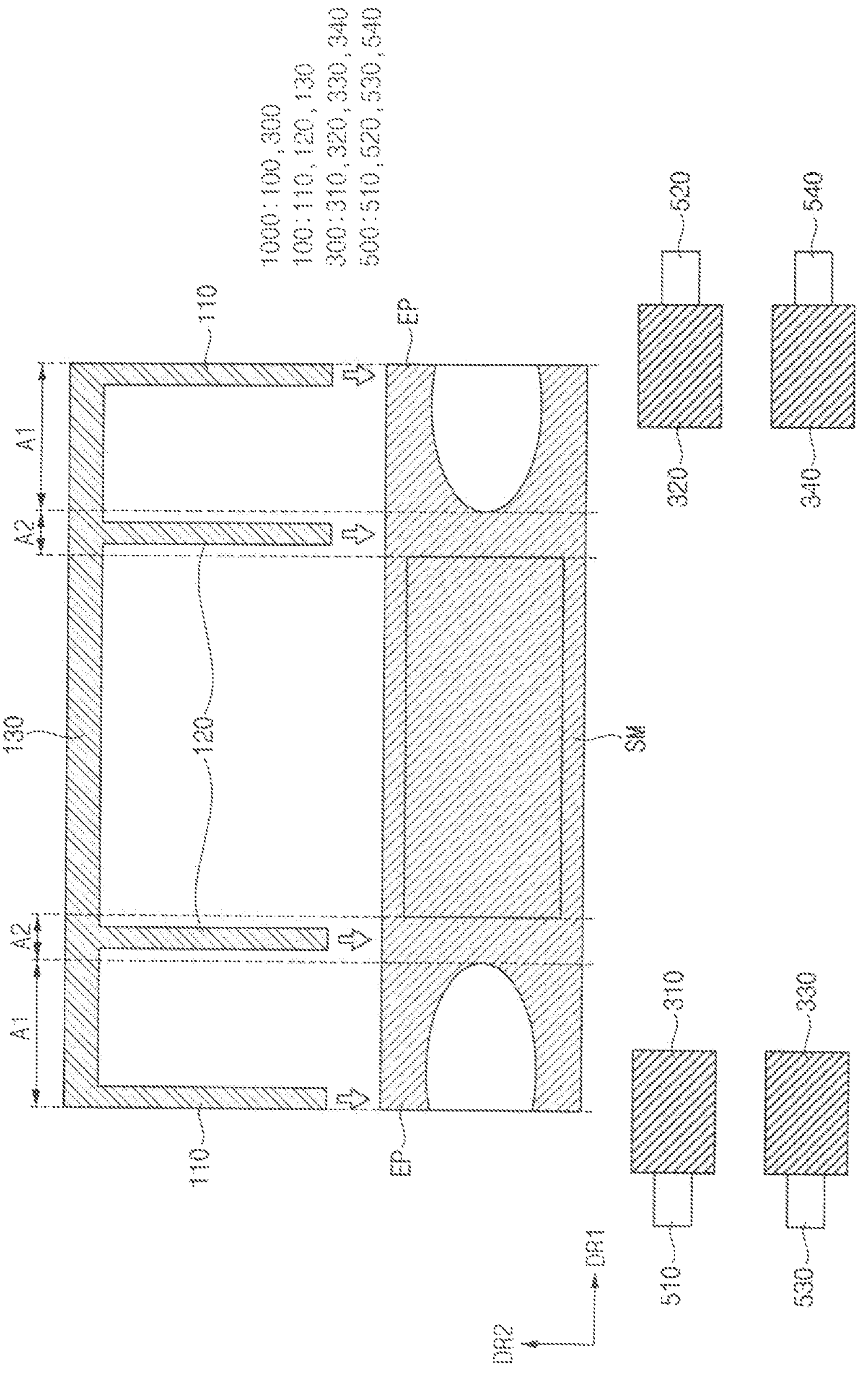
FIG. 3 is a schematic plan view illustrating a loading apparatus for a deposition mask according to an embodiment.
Figure 4:
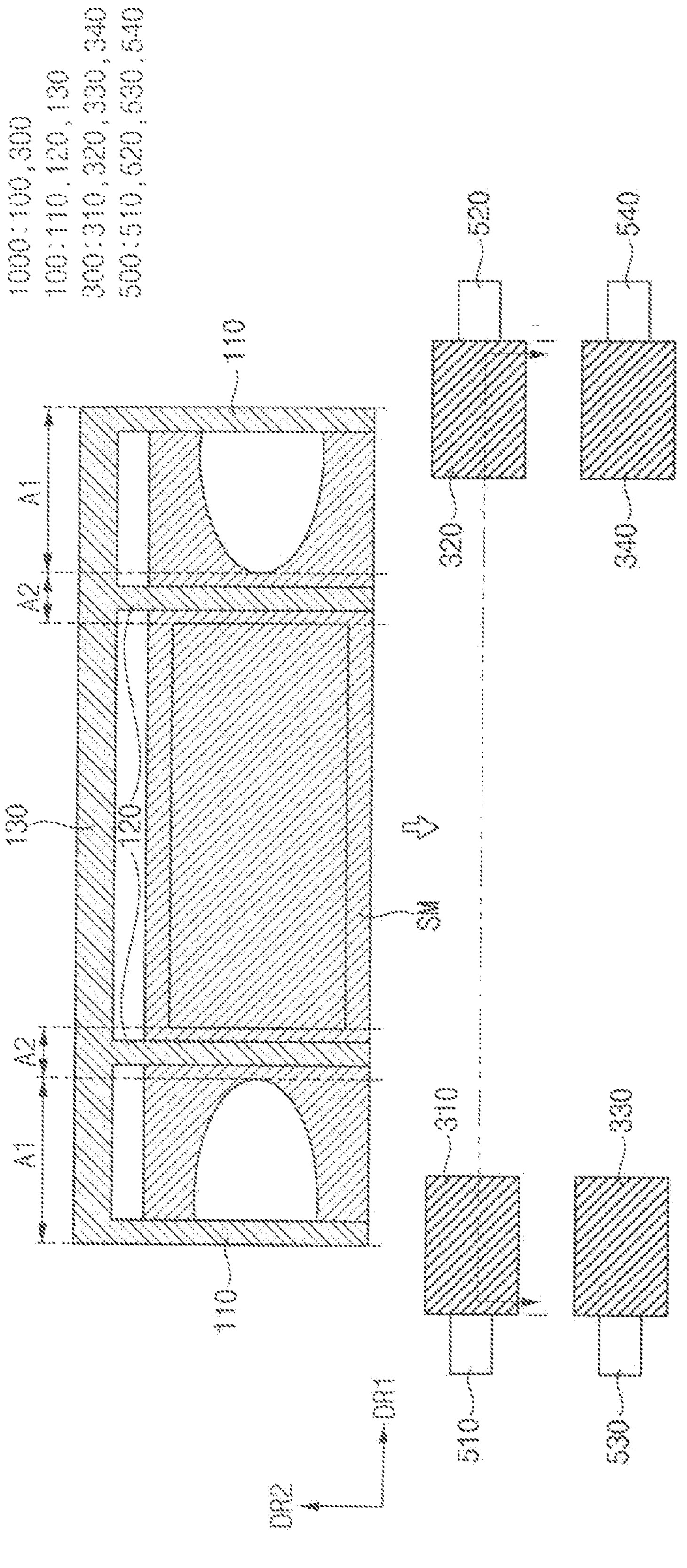
FIG. 4 is a schematic plan view illustrating that a picker included in the loading apparatus of FIG. 3 has adsorbs a mask.
Figure 5:
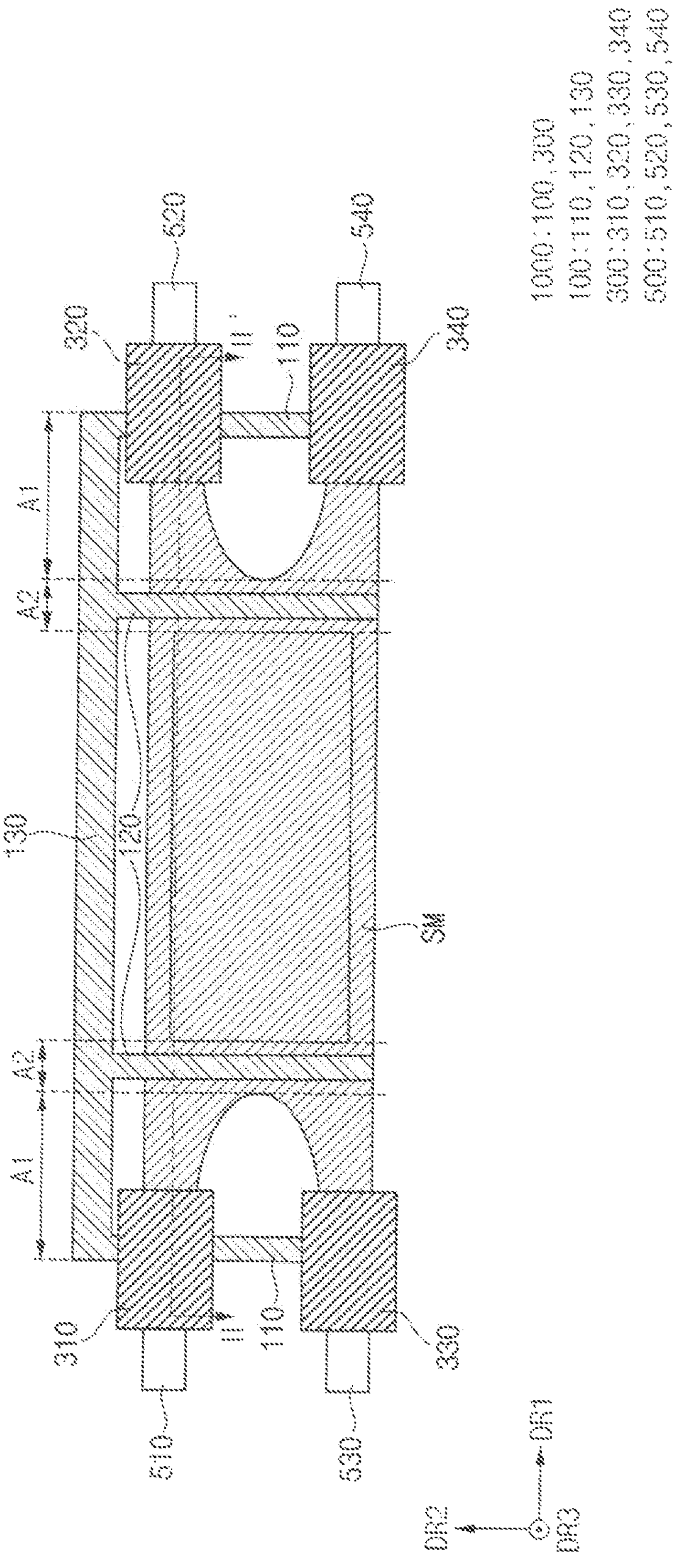
FIGS. 5 and 6 are schematic plan views illustrating that the picker of FIG. 4 transfers a mask.
Figure 6:
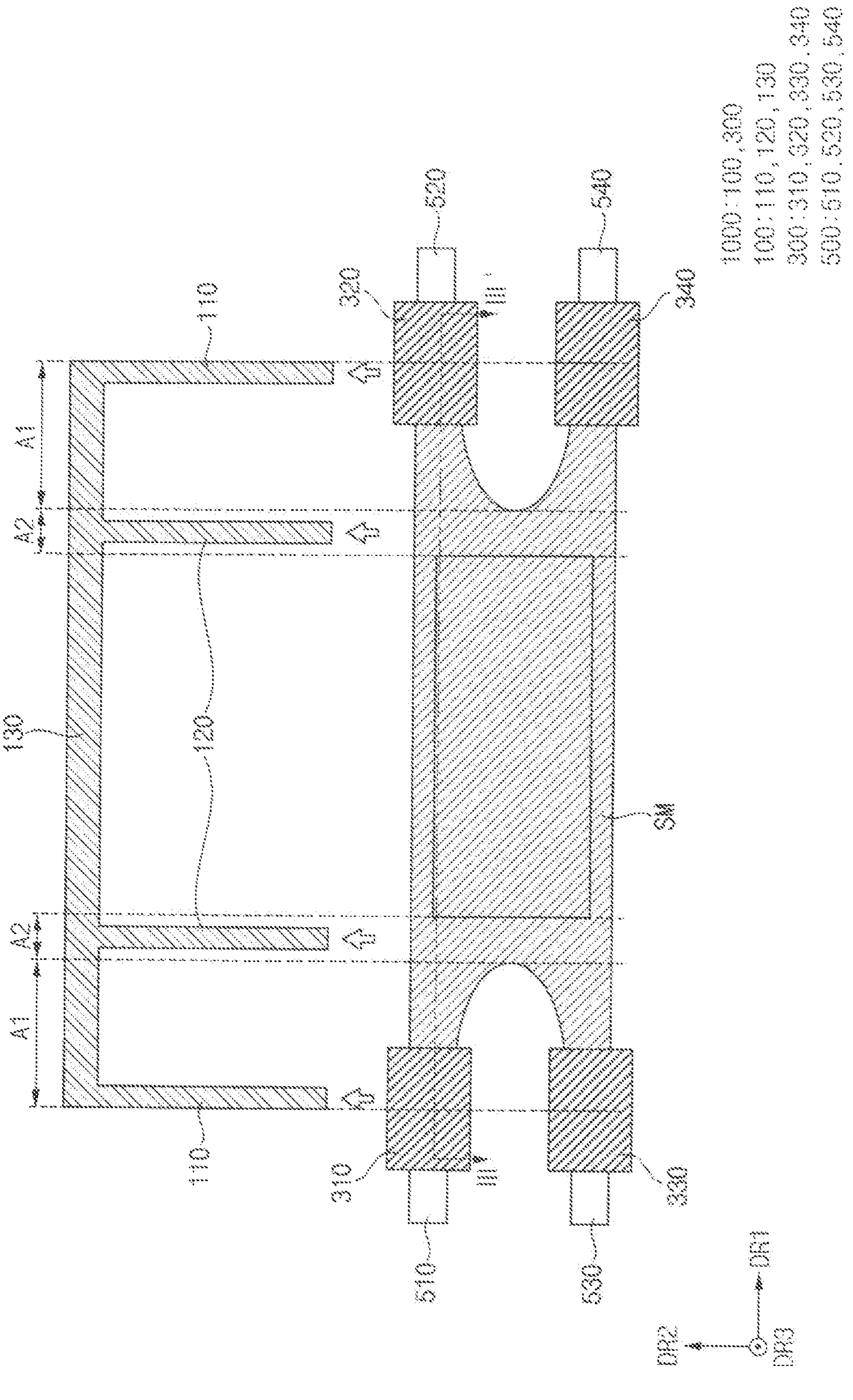

FIG. 3 is a schematic plan view illustrating a loading apparatus for a deposition mask according to an embodiment. FIG. 4 is a schematic plan view illustrating that a picker included in the loading apparatus of FIG. 3 has adsorbs a mask. FIGS. 5 and 6 are schematic plan views illustrating that the picker of FIG. 4 transfers a mask.

Referring to FIGS. 3 to 6, a loading apparatus 1000 for the deposition mask according to an embodiment of the disclosure may include a picker 100 and a clamper 300.

The picker 100 may transfer and may load the mask SM to the clamper 300 in a flat state. The clamper 300 may clamp the mask SM in a flat state. This will be described below.

The picker 100 may include a first adsorption unit (or first adsorption part) 110, a second adsorption unit (or second adsorption part) 120, and a connection unit (or connection part) 130.

The first adsorption unit 110 may be disposed at a position corresponding to the first area A1 of the mask SM. The first adsorption unit 110 may be disposed at a position corresponding to the end EP of the mask SM. The first adsorption unit 110 may extend in the second direction DR2. The first adsorption unit 110 may be provided as a pair.

The second adsorption unit 120 may be disposed at a position corresponding to the second area A2 of the mask SM. The second adsorption unit 120 may be disposed between the pair of first adsorption units 110. The second adsorption unit 120 may extend in the second direction DR2. The second adsorption unit 120 may be provided as a pair.

The connection unit 130 may be connected to the first adsorption unit 110 and the second adsorption unit 120. The connection unit 130 may be provided integrally with (or may be integral with) the first adsorption unit 110 and the second adsorption unit 120. The connection unit 130 may extend in the first direction DR1.

Referring to FIGS. 3 and 4, the first adsorption unit 110 and the second adsorption unit 120 may adsorb the mask SM. The first adsorption unit 110 may adsorb the both ends EP of the mask SM. The second adsorption unit 120 may adsorb between the both ends EP of the mask SM.

In an embodiment, the first adsorption unit 110 may adsorb the both ends EP of the mask SM using vacuum (or vacuumization). The first adsorption unit 110 may serve to prevent the both ends EP of the mask SM from sagging.

In an embodiment, the second adsorption unit 120 may adsorb the mask SM using vacuum or magnetic force. The second adsorption unit 120 may serve to support the mask SM.

An adsorption power of the second adsorption unit 120 may be greater than or equal to an adsorption power of the first adsorption unit 110. However, the disclosure is not limited thereto. For example, the adsorption force of the first adsorption unit 110 and the adsorption force of the second adsorption unit 120 may be adjusted to maintain the mask SM in a flat state.

Referring to FIGS. 4 and 5, the picker 100 may transfer and load the mask SM to the clamper 300. For example, after the first adsorption unit 110 and the second adsorption unit 120 adsorb the mask SM, the picker 100 may transfer the mask SM.

After the mask SM is transferred and loaded to the clamper 300, the clamper 300 may clamp the mask SM.

After the clamper 300 clamps the mask SM, the first adsorption unit 110 and the second adsorption unit 120 may separate and may desorb the mask SM.

In case that the first adsorption unit 110 and the second adsorption unit 120 separate and desorb the mask SM, the picker 100 may move in a third direction DR3 intersecting the plane. The third direction DR3 may be perpendicular to the plane.

Referring to FIGS. 5 and 6, the picker 100 may move in a direction parallel to the plane. For example, the picker 100 may move in the second direction DR2.

Figure 7:
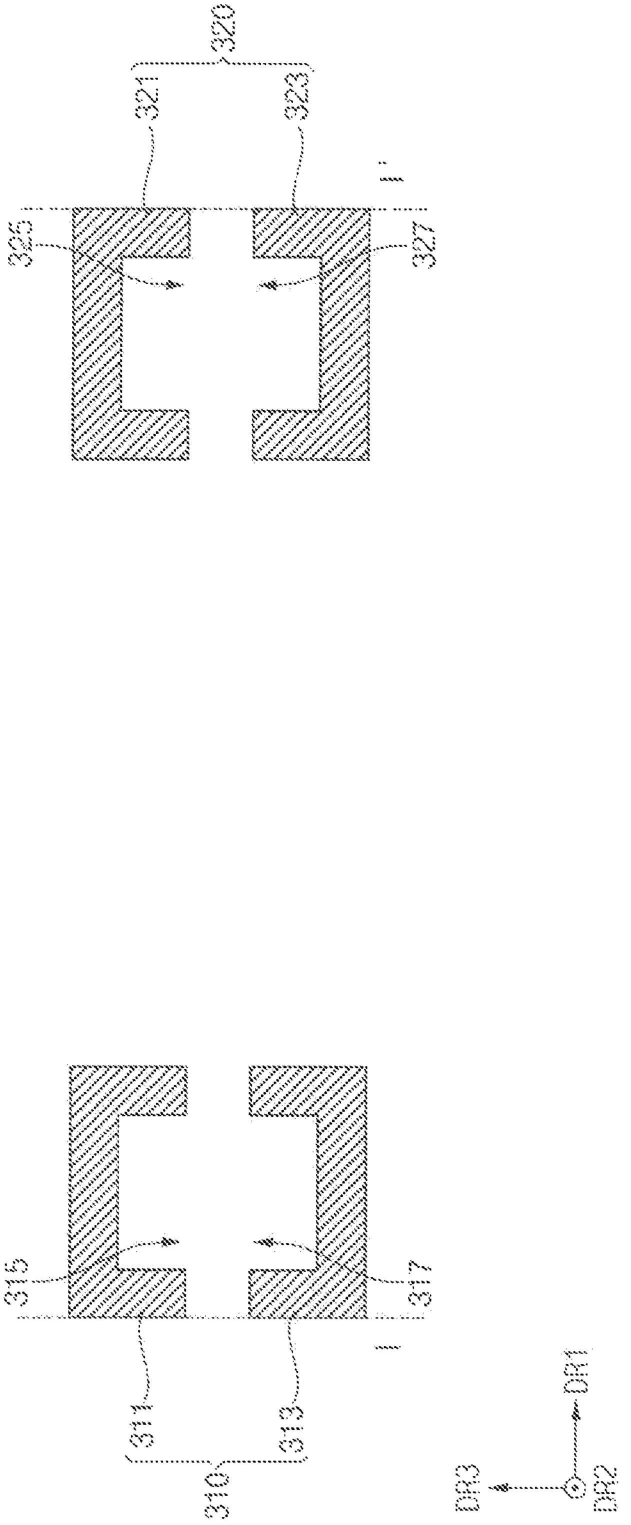
FIG. 7 is a schematic cross-sectional view taken along line I-I' of FIG. 4.

FIG. 7 is a schematic cross-sectional view taken along line I-I' of FIG. 4.

Referring to FIGS. 4 and 7, the clamper 300 may include lower clampers 313 and 323 and upper clampers 311 and 321.

The first clamper 310 may include a first lower clamper 313 and a first upper clamper 311 disposed on the first lower clamper 313. The second clamper 320 may include a second lower clamper 323 and a second upper clamper 321 disposed on the second lower clamper 323.

The first upper clamper 311 may include a first groove 315. The first groove 315 may be positioned in a central portion of the first upper clamper 311. The first groove 315 may be formed on a lower surface of the first upper clamper 311. Although the first groove 315 is shown to have a substantially rectangular shape in cross-section, a cross-sectional shape of the first groove 315 is not limited thereto. The cross-sectional shape of the first groove 315 may be a polygon, a polygon with rounded corners, a circle, a semi-circle, etc.

The first lower clamper 313 may include a second groove 317. The second groove 317 may be positioned in a central portion of the first lower clamper 313. The second groove 317 may be formed on an upper surface of the first lower clamper 313. The second groove 317 of the first lower clamper 313 may correspond to the first groove 315 of the first upper clamper 311. For example, a size of the first groove 315 and a size of the second groove 317 may be substantially the same. The first lower clamper 313 may have a shape symmetrical to the first upper clamper 311.

Since the second clamper 320 and the first clamper 310 may have substantially the same structure, a description of the second clamper 320 will be omitted.

Figure 8:
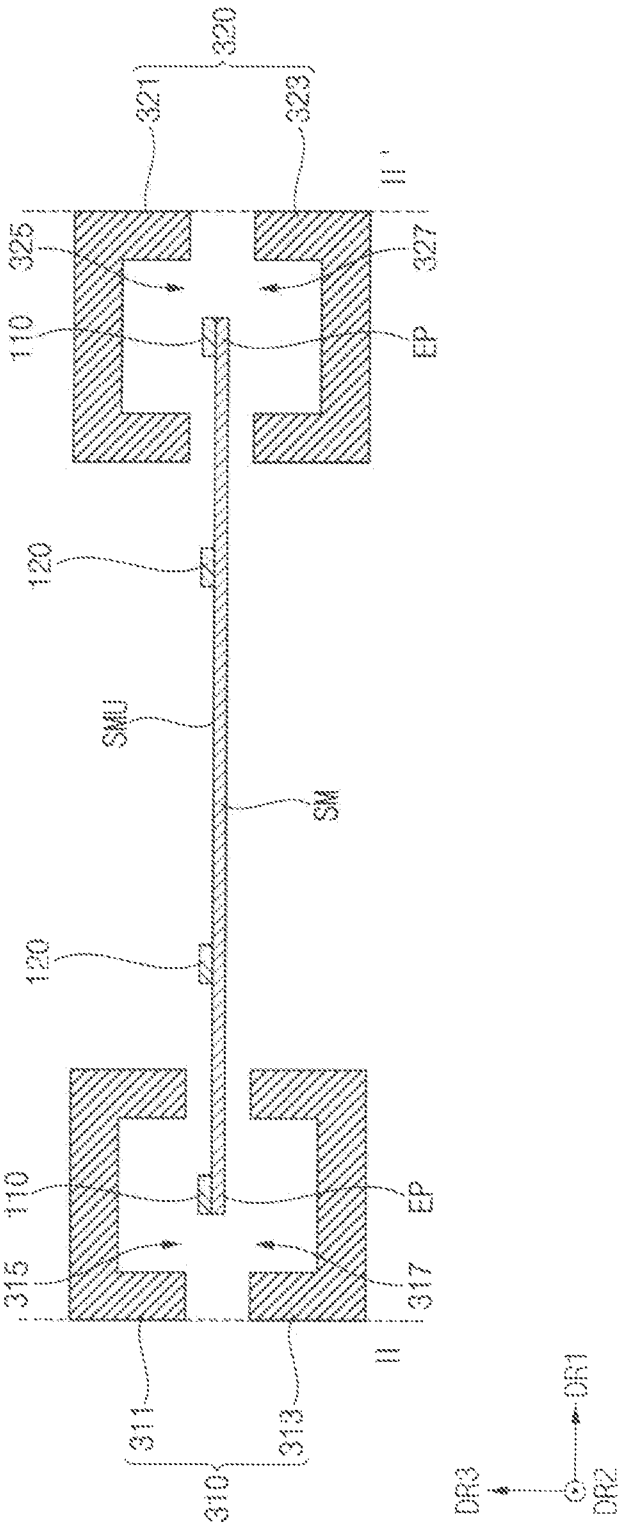
FIGS. 8 to 10 are schematic cross-sectional views taken along line II-II' of FIG. 5.
Figure 9:
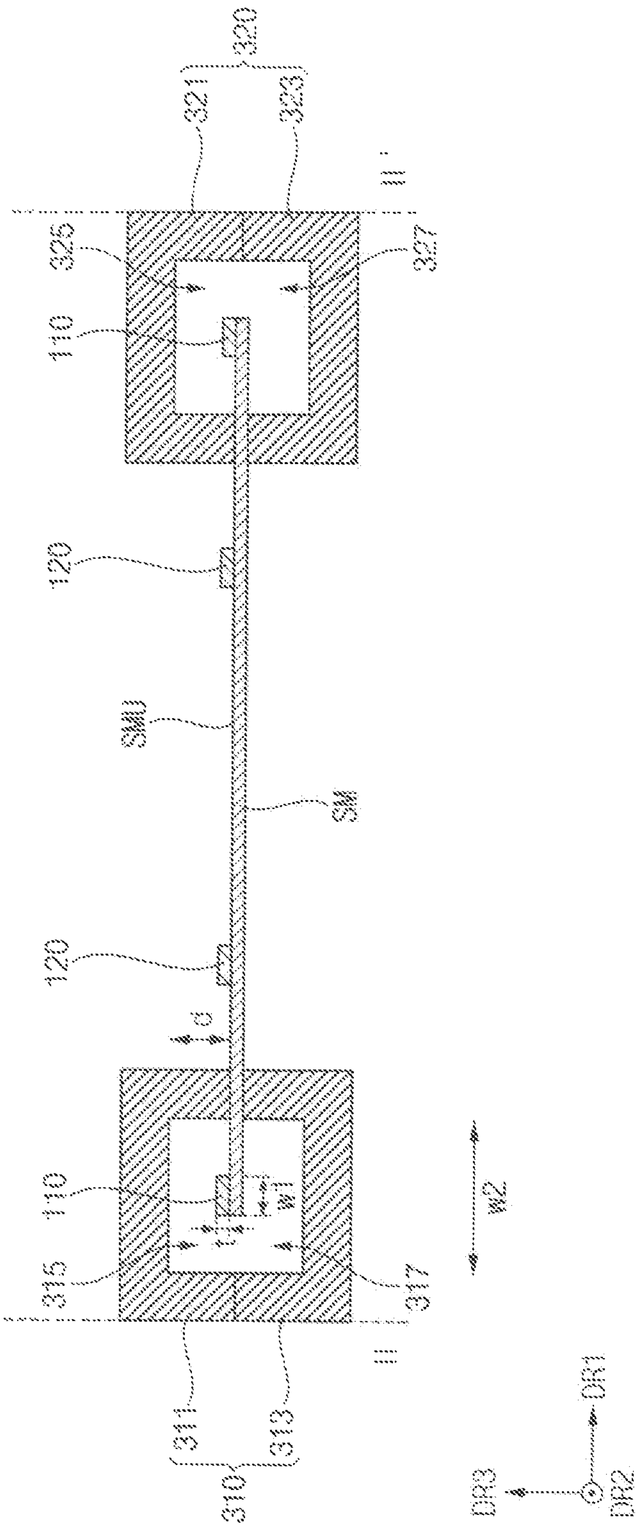
Figure 10:
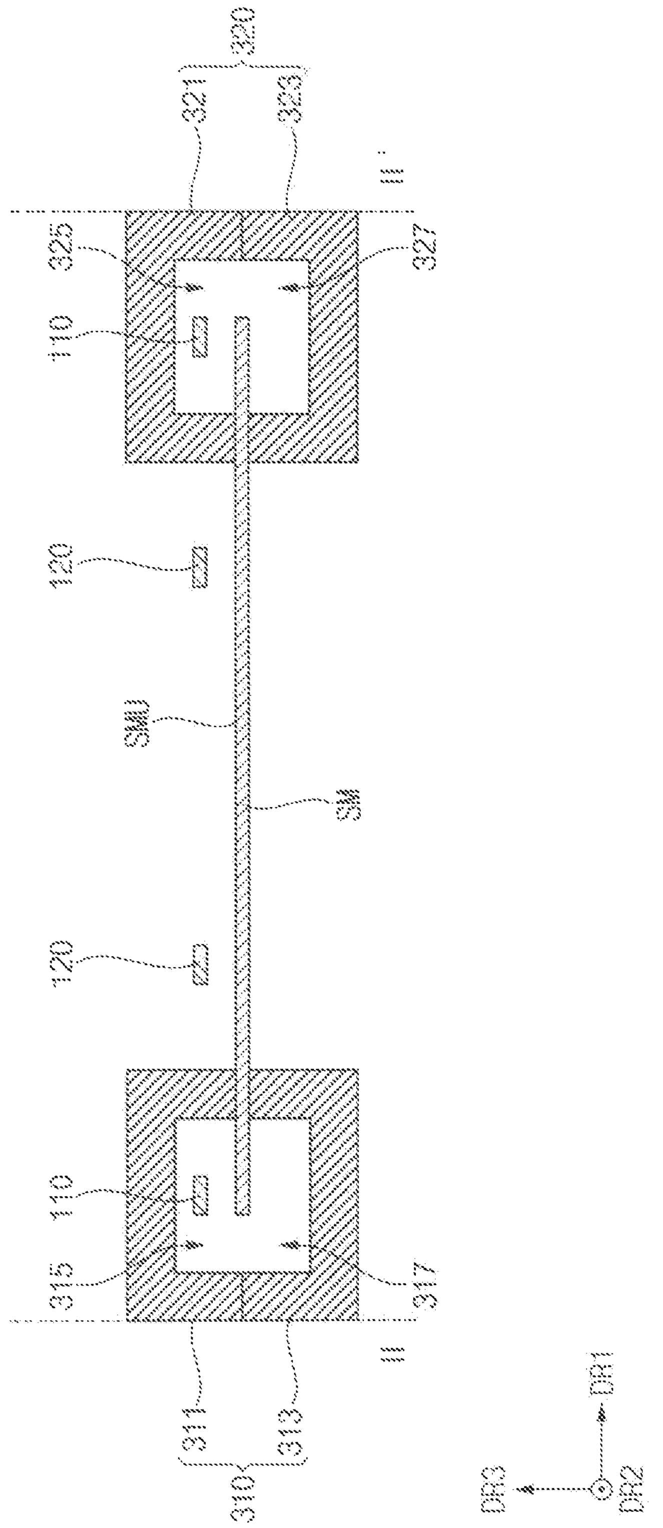

FIGS. 8 to 10 are schematic cross-sectional views taken along line II-II' of FIG. 5.

Referring to FIGS. 5 and 8, the first adsorption unit 110 and the second adsorption unit 120 may adsorb an upper surface SMU of the mask SM. The first adsorption unit 110 may adsorb the ends (e.g., the both ends) EP of the mask SM. As the first adsorption unit 110 adsorbs the both ends EP of the mask SM, the first adsorption unit 110 may serve to prevent the both ends EP of the mask SM from sagging. Accordingly, the mask SM may be transferred to the clamper 300 in a flat state. Although the first adsorption unit 110 and the second adsorption unit 120 are shown to have a substantially rectangular shape in cross section, the cross-sectional shape of each of the first adsorption unit 110 and the second adsorption unit 120 is not limited thereto. The cross-sectional shape of each of the first adsorption unit 110 and the second adsorption unit 120 may be a polygon, a polygon with rounded corners, a circle, a semicircle, or the like.

After the first adsorption unit 110 and the second adsorption unit 120 adsorb the mask SM, the picker 100 may transfer and may load the mask SM to the clamper 300. The picker 100 may move in a direction parallel to the plane, and the mask SM may be transferred and loaded between the upper clampers 311 and 321 and the lower clampers 313 and 323.

In case that the picker 100 transports and loads the mask SM, the first adsorption unit 110 may overlap the clampers 310 and 320, and the second adsorption unit 120 may not overlap the clampers 310 and 320. The first adsorption unit 110 may be positioned in the first groove 315. The second adsorption unit 120 may be positioned outside the first groove 315.

Referring to FIGS. 5 and 9, as the upper clampers 311 and 321 and the lower clampers 313 and 323 are closed, the clampers 310 and 320 may clamp the mask SM. The clampers 310 and 320 may clamp the mask SM between the first adsorption unit 110 and the second adsorption unit 120. The clampers 310 and 320 may contact the mask SM between the first adsorption unit 110 and the second adsorption unit 120.

A depth d of the first grooves 315 and 325 may be greater than a height t of the first adsorption unit 110. A width w2 of the first grooves 315 and 325 may be greater than a width w1 of the first adsorption unit 110. The first grooves 315 and 325 may provide a space in which the first adsorption unit 110 is disposed. Even in case that the clampers 310 and 320 clamp the mask SM, the first grooves 315 and 325 may provide a space so that the clampers 310 and 320 and the first adsorption unit 110 do not contact each other.

Since the upper clampers 311 and 321 include the first grooves 315 and 325, the upper clampers 311 and 321 may not contact the both ends EP of the mask SM. The upper clampers 311 and 321 may contact the mask SM between the first adsorption unit 110 and the second adsorption unit 120.

The lower clampers 313 and 323 may include second grooves 317 and 327 corresponding to the first grooves 315 and 325. The second grooves 317 and 327 may be formed on an upper surface of the lower clampers 313 and 323. The second grooves 317 and 327 may be symmetrical to the first grooves 315 and 325. The lower clampers 313 and 323 may have a symmetrical shape to the upper clampers 311 and 321.

The lower clampers 313 and 323 have a shape substantially symmetrical to the upper clampers 311 and 321, so that the lower clampers 313 and 323 may not contact the both ends EP of the mask SM. The lower clampers 313 and 323 may contact the mask SM between the first adsorption unit 110 and the second adsorption unit 120. Even if the picker

100 transfers and loads the mask SM to the clamper 300 in a flat state, in case that any one of the upper clampers 311 and 321 and the lower clampers 313 and 323 contact the mask SM, the clamper 300 may clamp the mask SM in a non-planar state. The lower clampers 313 and 323 have a substantially symmetrical shape to the upper clampers 311 and 321, so that the clamper 300 may clamp the mask SM in a flat state.

Referring to FIGS. 5 and 10, after the picker 100 is separated from and desorbed from the mask SM, the picker 100 may move in a vertical direction (e.g., the third direction DR3). Even in case that the picker 100 separates and desorbs the mask SM, the first adsorption unit 110 may not contact the clampers 310 and 320. For example, the first adsorption unit 110 may be spaced apart from the upper clampers 311 and 321.

Figure 11:
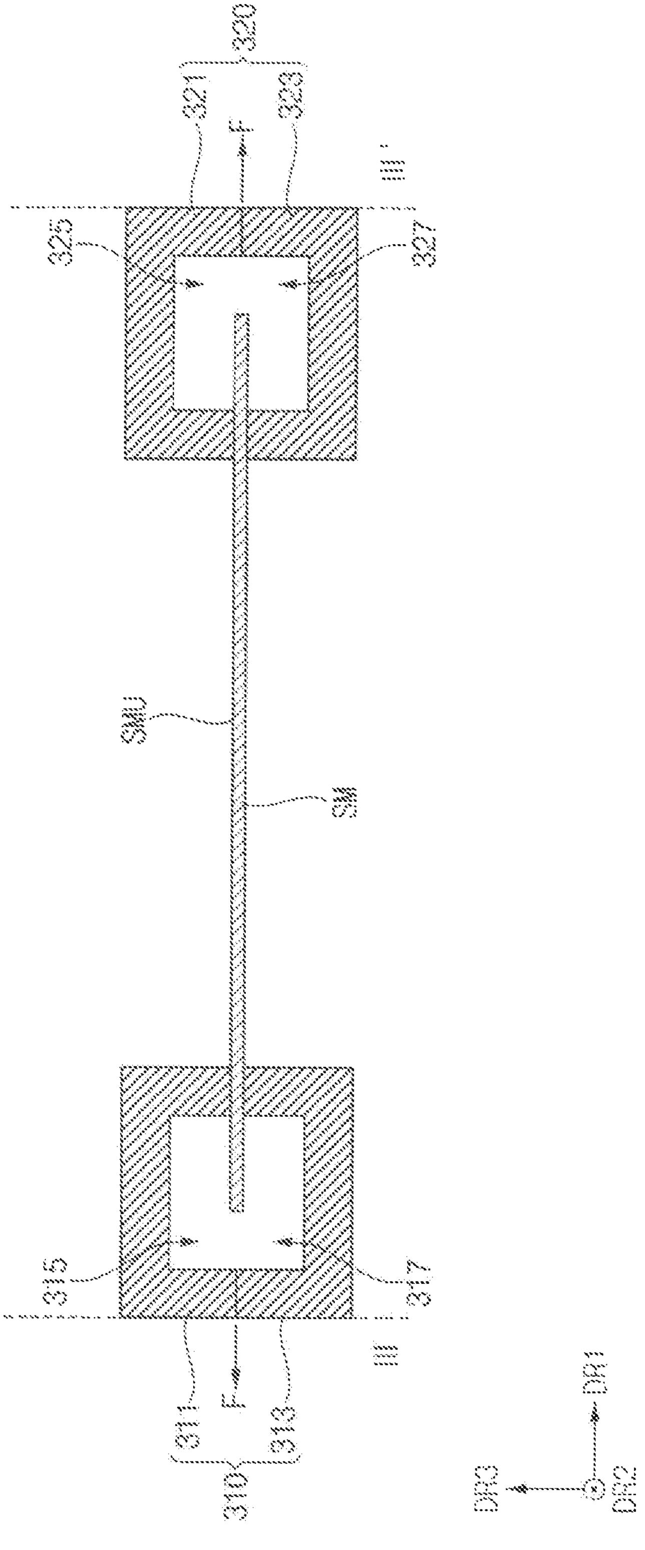
FIG. 11 is a schematic cross-sectional view taken along line of FIG. 6.

Referring to FIGS. 6 and 11, in case that the first adsorption unit 110 and the second adsorption unit 120 desorb and separate the mask SM, the picker 100 may move in a direction parallel to the plane. (e.g., in the second direction DR2). The tensioner 500 may tension the mask SM in both directions (e.g., the first direction DR1 and a direction opposite to the first direction DR1).

As the picker 100 transfers and loads the mask SM in a flat state, and the clamper 310 and 320 clamps the mask SM in a flat state, the mask SM may be tensioned and welded in a flat state. Accordingly, the reliability of the deposition mask loading apparatus 1000 may be improved.

The above description is an example of technical features of the disclosure, and those skilled in the art to which the disclosure pertains will be able to make various modifications and variations. Therefore, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A loading apparatus for a deposition mask, the loading apparatus comprising:
- a clamper configured to clamp a mask extending in a first direction; and
- a picker including:
- a first adsorption part;
- a second adsorption part; and
- a connection part connected to the first adsorption part and the second adsorption part, and configured to transfer the mask to the clamper, wherein
- when the picker transfers the mask, the first adsorption part adsorbs ends of the mask and the second adsorption part adsorbs a portion of the mask between the ends of the mask, and
- the clamper is configured to clamp the mask between the first adsorption part and the second adsorption part.

2. The loading apparatus of claim 1, wherein the clamper includes:
- a lower clamper; and
- an upper clamper disposed on the lower clamper and including a first groove.

3. The loading apparatus of claim 2, wherein the first groove is in a lower surface of the upper clamper.

4. The loading apparatus of claim 2, wherein a depth of the first groove is greater than a height of the first adsorption part.

5. The loading apparatus of claim 2, wherein a width of the first groove is greater than a width of the first adsorption part.

6. The loading apparatus of claim 2, wherein the picker transfers the mask between the lower clamper and the upper clamper.

7. The loading apparatus of claim 6, wherein the first adsorption part is positioned in the first groove.

8. The loading apparatus of claim 6, wherein the second adsorption part is positioned outside the first groove.

9. The loading apparatus of claim 6, wherein the picker moves in a vertical direction after the picker is separated from the mask.

10. The loading apparatus of claim 9, wherein the first adsorption part is spaced apart from the upper clamper.

11. The loading apparatus of claim 2, wherein the lower clamper includes a second groove corresponding to the first groove.

12. The loading apparatus of claim 11, wherein the second groove is in an upper surface of the lower clamper.

13. The loading apparatus of claim 11, wherein the lower clamper has a shape symmetrical to a shape of the upper clamper.

14. The loading apparatus of claim 1, wherein the first adsorption part and the second adsorption part adsorb an upper surface of the mask.

15. The loading apparatus of claim 1, wherein the first adsorption part adsorbs the mask using vacuum.

16. The loading apparatus of claim 1, wherein the second adsorption part adsorbs the mask using vacuum or magnetic force.

17. The loading apparatus of claim 1, wherein the first adsorption part prevents the ends of the mask from sagging.

18. The loading apparatus of claim 1, wherein the second adsorption part supports the mask.

19. The loading apparatus of claim 1, wherein the first adsorption part and the second adsorption part extend in a second direction intersecting the first direction.

20. The loading apparatus of claim 4, a width of the first groove is greater than a width of the first adsorption part.

* * * * *